(12) United States Patent
Denham

(10) Patent No.: US 8,750,060 B2
(45) Date of Patent: Jun. 10, 2014

(54) REPAIR DEVICE AND METHOD FOR INTEGRATED CIRCUIT STRUCTURED ARRAYS

(75) Inventor: Martin S. Denham, Bend, OR (US)

(73) Assignee: Raytheon Company, Waltham, MA (US)

( * ) Notice: Subject to any disclaimer, the term of this patent is extended or adjusted under 35 U.S.C. 154(b) by 290 days.

(21) Appl. No.: 13/411,967

(22) Filed: Mar. 5, 2012

(65) Prior Publication Data

US 2013/0229886 A1 Sep. 5, 2013

(51) Int. Cl.
*G11C 7/00* (2006.01)

(52) U.S. Cl.
USPC .................. 365/200; 365/189.07; 365/230.06

(58) Field of Classification Search
CPC ..... G11C 8/10; G11C 11/408; G11C 11/4087
USPC ................................ 365/200, 189.07, 230.06
See application file for complete search history.

(56) References Cited

U.S. PATENT DOCUMENTS

| | | |
|---|---|---|
| 3,969,634 A | 7/1976 | Su et al. |
| 4,761,606 A | 8/1988 | Germer et al. |
| 5,972,076 A | 10/1999 | Nichols et al. |
| 6,091,531 A | 7/2000 | Schwartz et al. |
| 6,169,444 B1 | 1/2001 | Thurber, Jr. |
| 6,492,830 B1 | 12/2002 | Ju et al. |
| 6,512,411 B2 | 1/2003 | Meng et al. |
| 6,781,434 B2 | 8/2004 | Jensen et al. |
| 7,277,307 B1 * | 10/2007 | Yelluru ........................ 365/49.1 |
| 8,009,077 B1 | 8/2011 | Melanson |
| 8,098,316 B2 | 1/2012 | Parks |
| 8,102,455 B2 | 1/2012 | Parks |

OTHER PUBLICATIONS

U.S. Appl. No. 13/446,495, filed Apr. 13, 2012, Martin S. Denham.
U.S. Appl. No. 13/866,066, filed Apr. 19, 2013, Martin S. Denham et al.

* cited by examiner

*Primary Examiner* — Son Dinh
*Assistant Examiner* — Nam Nguyen
(74) *Attorney, Agent, or Firm* — Lando & Anastasi, LLP

(57) ABSTRACT

A method and apparatus for repairing digital addressable structured arrays, such as memory devices. In one example, a repair mechanism includes adding a number of redundant repair elements to the array, and coupling one or more skip units to the array ahead of the address decode unit(s). The skip unit compares a received logical address with a skip address identifying a defective element within the array, and modifies the input address based on a comparison of the input address and the skip address. The modified address is then decoded to access an element of the array.

17 Claims, 7 Drawing Sheets

REPAIR DEVICE AND METHOD FOR INTEGRATED CIRCUIT STRUCTURED ARRAYS

BACKGROUND

Manufacturing defects are a normal occurrence in the fabrication of integrated circuits (ICs). These defects can be caused by particulates and/or other irregularities associated with IC fabrication. Defects can occur before an IC is tested or packaged, and that is most frequently the case. However, defects known as "infant mortality" can also occur during test and burn-in. Infant mortality is often associated with IC structures that were marginally created (such as narrow metal lines or via tear-drop voids, for example). Defects can also occur from using an IC in an extreme condition. Examples include excessive use, voltage transients, electro-static discharge, non-infant-mortality effects such as hot-electrons or negative bias temperature instability, oxide damage, or radiation damage (such as spaced-based alpha, gamma, or cosmic rays).

In order to effect use of redundant components for repair of a regular structure, such as a memory device, for example, static random access memory (SRAM), steering of read, write, or other operations away from the bad component and to the good component is implemented. A common conventional method of steering has been to use a multiplexor and demultiplexor (MUX and DEMUX) to direct operations away from the bad components and to the good components. One common steering approach is to use a "nearest neighbor" approach, which requires the insertion of circuitry associated with rows or columns, and can therefore negatively impact performance, area, or complexity of implementation of the memory device.

SUMMARY

Aspects and embodiments are directed to a repair mechanism for a regular structured array of elements, such as an SRAM, register files, or other integrated circuit (IC) memory device.

According to one embodiment, a repair device for a digital addressable structured array of elements comprises at least one set of repair elements placed within the structured array, at least one skip unit configured to receive and modify an input address of a defective array element within the array and to provide a modified address corresponding to a non-defective array element within the array, and an address decode unit coupled between the at least one skip unit and the array and configured to receive and decode the modified address from the skip unit.

In one example, the addressable structured array of elements is a static random access memory (SRAM). The elements of the addressable structured array may be arranged in rows and columns. In one such example, the at least one set of repair elements may include at least one row of repair elements, and the address decode unit includes a row-address decode unit. In another such example, the at least one set of repair elements includes at least one column of repair elements, and the address decode unit includes a column-address decode unit.

In one example, the repair device includes two rows of repair elements, a first skip unit and a second skip unit, the first and second skip units being cascaded together in series. The first skip unit may be configured to provide a first modified address, the first modified address being higher than the input address, and the second skip unit may be configured to receive the first modified address and to provide a second modified address, the second modified address being higher than the first modified address. In another example, the first skip unit is configured to provide a first modified address, the first modified address being lower than the input address, and the second skip unit is configured to receive the first modified address and to provide a second modified address, the second modified address being lower than the first modified address.

In another example of the repair device, the at least one skip unit includes a comparator configured to receive and compare the input address and a skip address, and to provide a modification command responsive to determining that the input address is equal to or greater than the skip address, and a logical adder coupled to the comparator and configured to add a predetermined number to the input address to provide the modified address responsive to the modification command. In one example, the comparator includes a first adder, and the logical adder includes a second adder, and the skip unit further includes a first inverter and a second inverter, wherein an output of the first adder is coupled via the first inverter to an input of the second adder. The repair device may further comprise a control unit coupled to the skip unit and configured to provide the skip address to the skip unit, the skip address identifying the defective array element. In one example, the control unit includes a programmable read-only memory configured to store the skip address.

According to another embodiment, an integrated circuit including a built-in repair device comprises at least one digital addressable structured array of elements having a plurality of elements arranged in rows and columns, a decode address unit coupled to the at least one digital addressable structured array, at least one set of repair elements contained within the at least one digital addressable structured array, and at least one skip unit coupled to the decode address unit, the skip unit having a first input to receive an input address and a second input to receive a skip address, the skip address identifying a defective element within the at least one digital addressable structured array, wherein the skip unit is configured to modify the input address based on a determination that the input address is equal to or greater than the skip address and to provide a modified address to the address decode unit.

In one example of the integrated circuit, at least one digital addressable structured array of elements includes a plurality of SRAM modules, the at least one set of repair elements includes a plurality of independent sets of repair units, at least one set of repair units being contained within each one of the plurality of SRAM modules, and the at least one skip unit includes a corresponding plurality of skip units, such that at least one skip unit is associated with each SRAM module. The integrated circuit may further comprise an analog array coupled to at least one of the plurality of SRAM modules.

According to another embodiment, a method of repairing a digital addressable structured array of elements comprises receiving an input address, receiving a skip address identifying a defective element within the digital addressable structured array of elements, modifying the input address based on a comparison of the input address and the skip address to provide a modified address, and decoding the modified address to address a non-defective element within the digital addressable structured array of elements.

In one example of the method, modifying the input address includes determining that the input address is equal to or greater than the skip address, and adding a predetermined number to the input address to provide the modified address. In another example, receiving the skip address includes receiving a first skip address and a second skip address. Modifying the input address may include determining that the input address is equal to or greater than the first skip address, adding a first predetermined number to the input address to provide an intermediate address, determining that the intermediate address is equal to or greater than the second skip address, and adding a second predetermined number to the intermediate address to provide the modified address.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Figure 1:
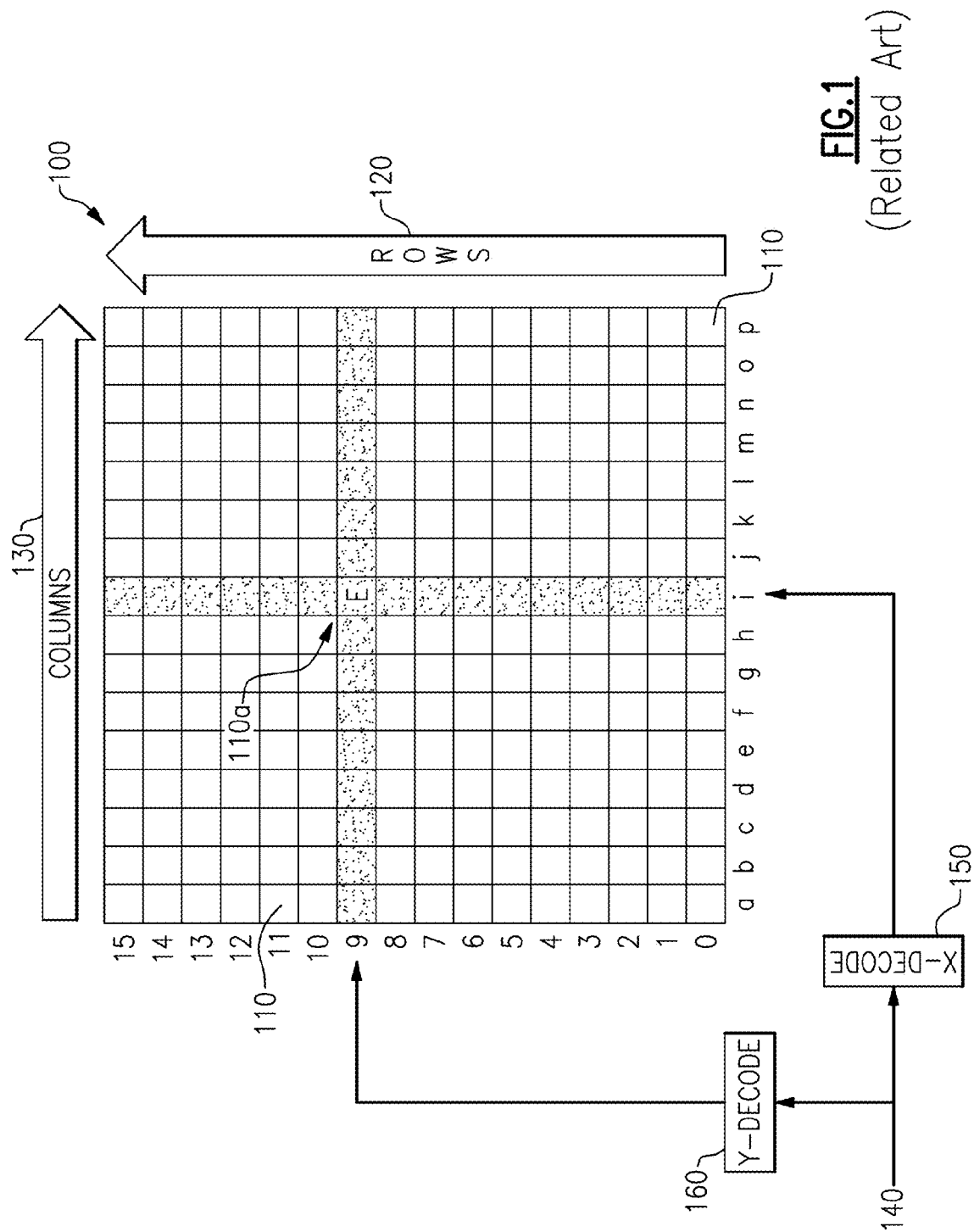
FIG. 1 is a schematic diagram illustrating an example of normal addressing and decode of a regular arrayed structure.

Aspects and embodiments relate to integrated circuit (IC) design, and more specifically, to addressable structures within an IC and potential manufacturing defects or defects that occur as a result of use of the IC. Some examples of addressable structures include Random Access Memories (RAMs, including Static and Dynamic), register files, or other circuits that have an array pattern. Aspects and embodiments directed to a process for implementing repair of a regular (or arrayed) structure and relate to one dimensional, two dimensional, and three dimensional structures (the third dimension may be created by chip stacking, for example). According to one embodiment, a number of skip units and a corresponding number of redundant elements are added to an array. The skip unit compares a logical address with a stored bad address entry (determined and stored when a defect has been detected), and if the logical address is equal to or greater than the bad address, the skip unit adds a value (e.g., one) to the logical address, and the final, adjusted address is decoded. In this manner, bad elements in an array are skipped and not used for reading, writing or processing digital values. As discussed further below, multiple skip units may be cascaded in ascending order, and any number N may be used for skip units and redundant elements. The combination of skip units and redundant (repair) elements ahead of an address decode unit provide a simple, effective repair mechanism that adds minimal structure to the array and may not burden the array with additional area, power requirements or complexity. Furthermore, if address performance is an issue, the skip computations can be pipelined.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiment. For example, various aspects described as being implemented in hardware may alternatively be implemented in software, or a combination of hardware and software. Similarly, aspects described as being implemented in software may alternatively be implemented in hardware, or a combination of hardware and software. For example, digital logic circuits, gates or components may be implemented in a hardware description language, such as Verilog, VHDL, or System C and subsequently reduced to gate or circuit form by any appropriate mechanism, as would be understood and appreciated by those skilled in the art, given the benefit of this disclosure.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

Referring to FIG. 1, there is illustrated a regular array 100 of elements 110 arranged in rows 120 and columns 130. The array 100 may be used for any of a wide variety of purposes. In one example, the array 100 is an SRAM array which stores digital values. The array 100 is addressable, and an address 140 is applied from another circuit (not shown) which has access to the array. For example, the address 140 may be an SRAM address, to effect a read or a write operation to an addressed element 110a. To uniquely identify the addressed element 110a, the address 140 may include an x-decode circuit 150 to select the corresponding column 130 and a y-decode circuit 160 to select the corresponding row 120. In FIG. 1, the array 100 is shown having sixteen rows 120 and sixteen columns 130; however, this example is illustrative only and the array may have any number of rows and columns, and need not have the same number of rows as columns. There are various decoding techniques that allow an algorithmic device (such as an address counter) to effectively address specific rows and specific columns of an arrayed structure.

Figure 2:
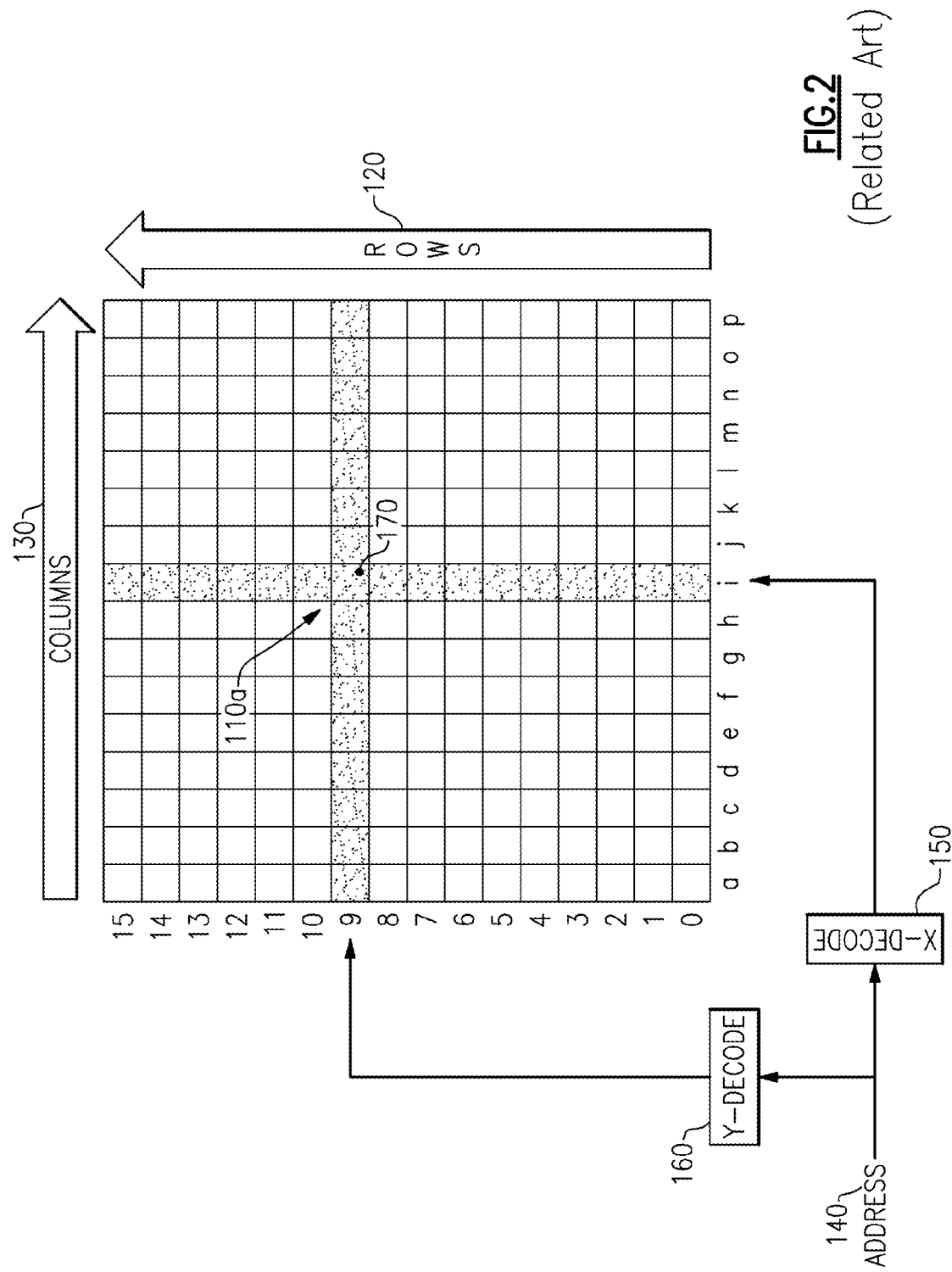
FIG. 2 is a schematic diagram illustrating an example of a single-element defect in a regular arrayed structure.
Figure 3:
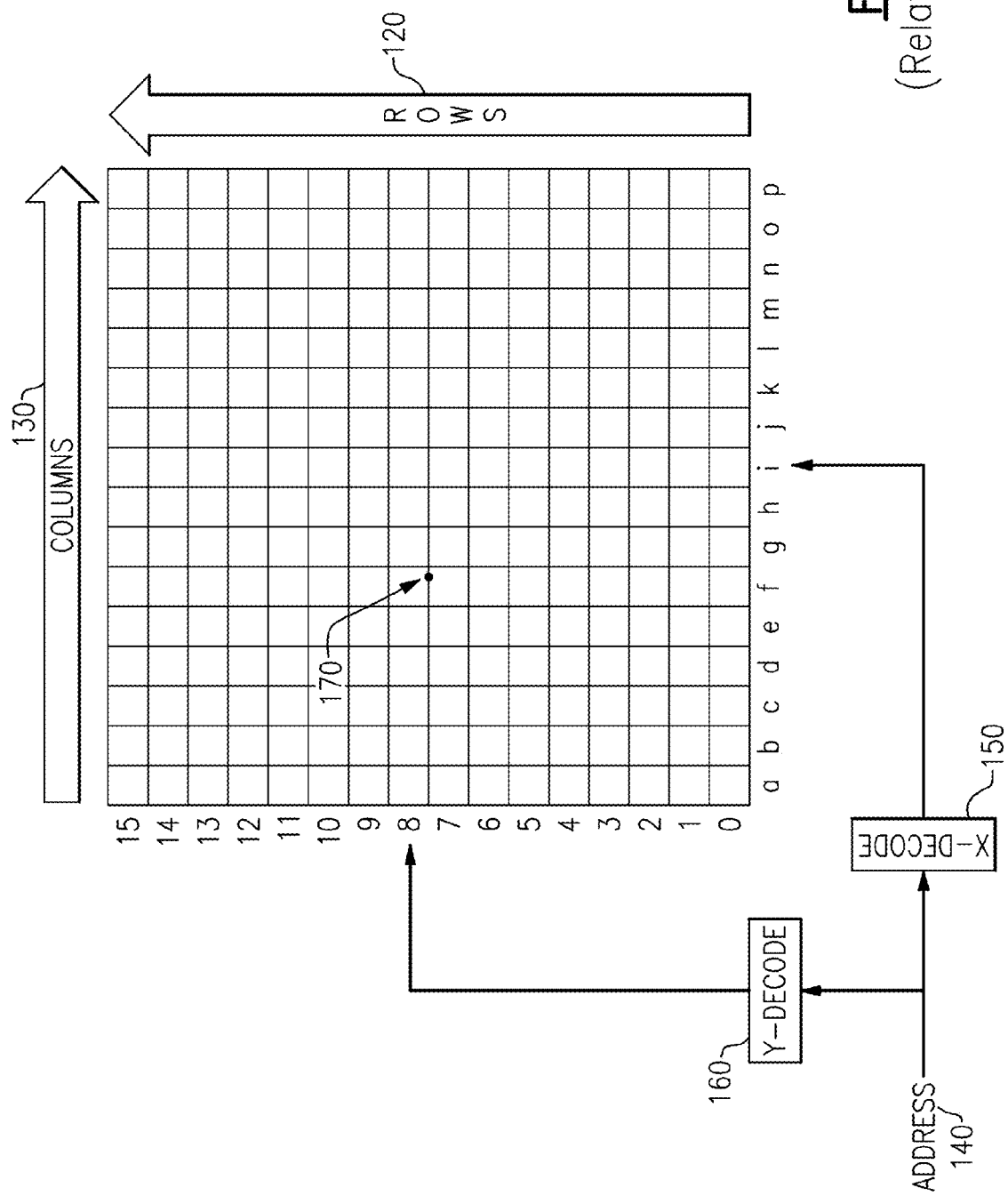
FIG. 3 is a schematic diagram illustrating an example of a multi-element defect in a regular arrayed structure.

Referring to FIG. 2, a defect 170 is illustrated in element 110a. The defect 170 may be any type of defect. For example, the defect 170 may include a short or open circuit that causes the element 110a to malfunction. In the example of an SRAM array, the defect 170 may be the inability of the element 110a (an SRMA cell) to store a digital value (e.g., a "1" or a "0"), or the inability to read back the content of the SRAM cell. The density (or frequency of occurrence) of these defects can be expressed as defects-per-square-centimeter, and may have a statistical distribution. Integrated circuit fabrication may experience lot-to-lot defect variations, in which the defects-per-square-centimeter can vary. In the example in FIG. 2, the defect 170 affects only a single addressable element. However, in other examples, the defect 170 may occur over the span of multiple addressable elements, as illustrated in FIG. 3. In the example illustrated in FIG. 3, the defect 170 overlaps rows 7 and 8 of column f. FIG. 3 demonstrates that a single point defect 170 may cause multiple element fails. Accordingly, embodiments of the repair mechanism may respond to such occurrences, as discussed further below.

As discussed above, according to one embodiment, there is provided a circuit method of repairing an arrayed structure using address skipping. The method may be used in connection with any array address structure that has input address and output (decoded) address selections, and may have particular usefulness in the context of digital memory arrays, as discussed further below. According to one embodiment, at least one set of additional repair elements is placed in the layout of the array to create "spare parts" to be used for repair. This set of repair elements may be a row or column of elements, for example. At least one corresponding skip unit is placed ahead of the corresponding (row or column) address decode unit. When necessary to avoid a defective array element, the skip units provide adjusted addresses to the address decode unit, as discussed below. Multiple skip units may be coupled together in series, as also discussed further below.

Figure 4:
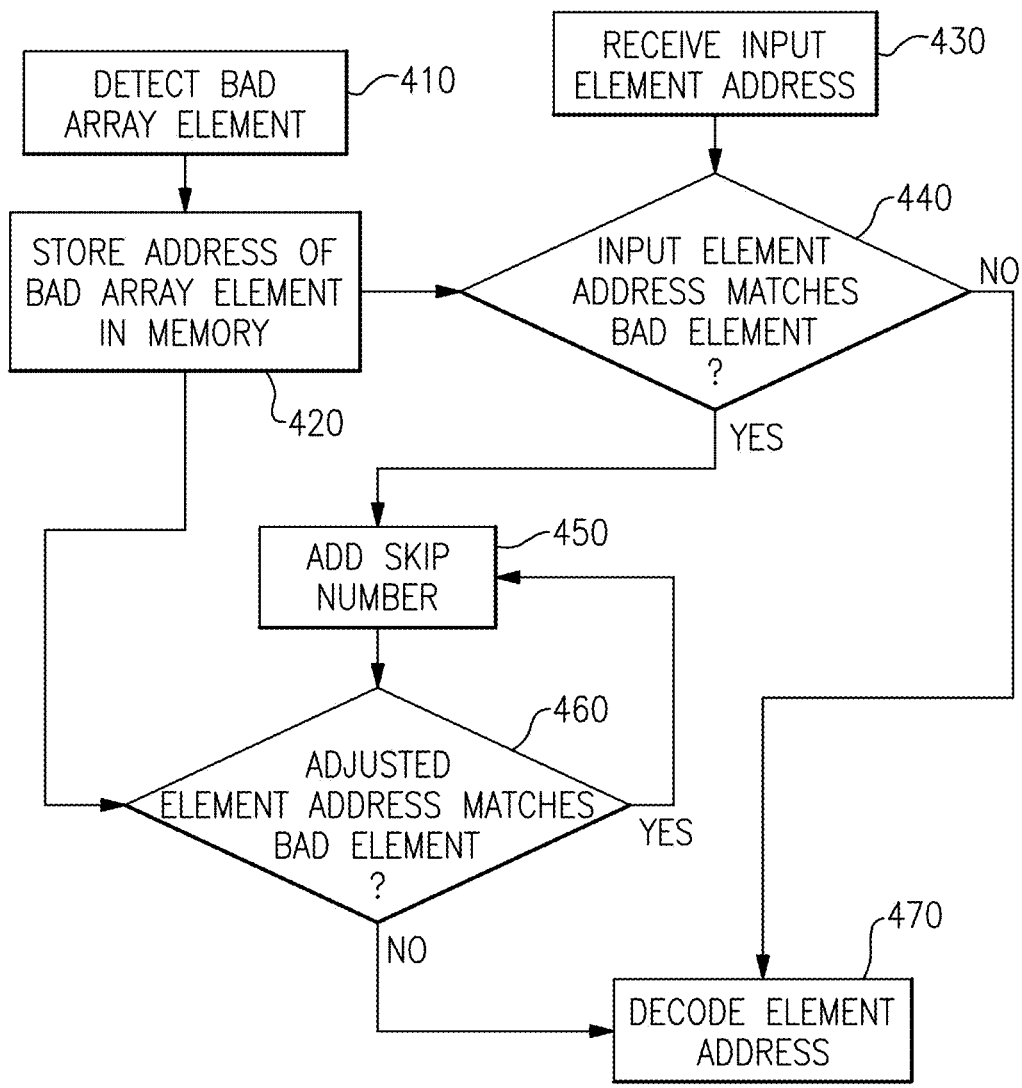
FIG. 4 is a flow diagram illustrated one example of a repair method according to aspects of the invention.

Referring to FIG. 4, there is illustrated a flow diagram corresponding to an example of a repair method according to one embodiment. When a "bad" array element is detected (step 410), for example, discovered during testing or a result of a failed operation, the address of the bad element is stored in a digital memory (step 420). When an input element address is received (step 430), for example, in a command, to read or write data to the array, the input address may be reviewed to determine whether it corresponds to a bad element address, also referred to as "skip address" (step 440). If the input address is that of a bad element that needs replacement, a skip unit adds a value to the address (e.g., adds one to the address) to supply an adjusted address (step 450). As discussed above, in one example, multiple skip units may be cascaded in series. Accordingly, in this example, the process may be repeated (step 460) to determine whether the adjusted address still corresponds to a bad element (for example, in the case of a defect that affects more than one adjacent element). Following the skip process, the address may be decoded (step 470) and the underlying operation (e.g., the read or write command) performed using the addressed element. In this manner, bad elements in an array may be avoided, and the array may continue to perform its normal functions.

Figure 5:
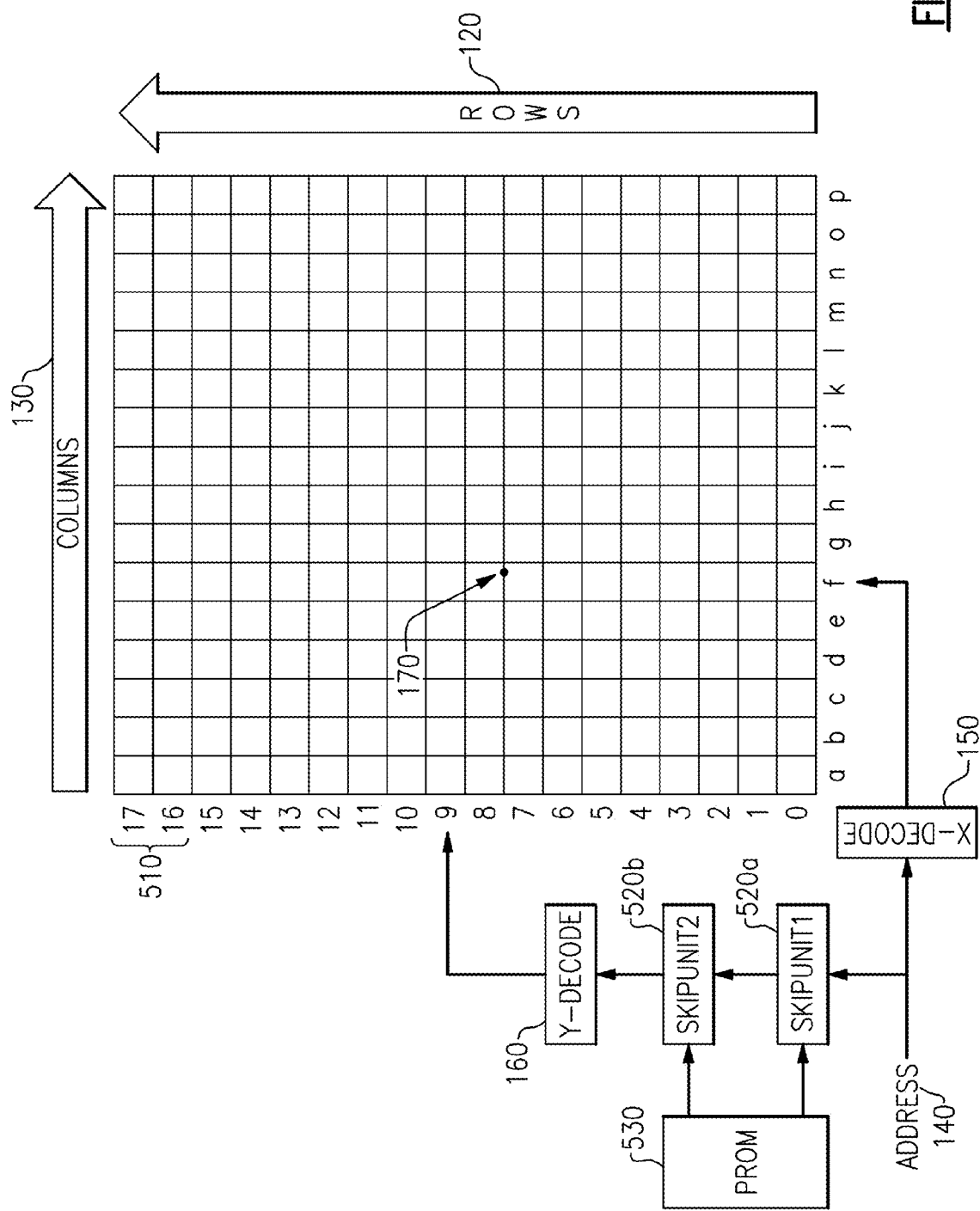
FIG. 5 is a diagram illustrating one example of a repair mechanism according to aspects of the invention.

Referring to FIG. 5 there is illustrated an example of a repair mechanism in which redundant rows 510 are placed within the array structure 500 to be used for repair. In the example illustrated in FIG. 5, there are two redundant rows 510; however, the number of redundant rows may vary and is not limited to two. In one example, the redundant rows 510 may be used as a mechanism for repair and not necessarily as additional primary capability. As discussed above, in addition to the redundant rows 510, the repair mechanism includes skip units 520a and 520b that are placed ahead of the y-decode circuit 160, as shown in FIG. 5. In one embodiment, the number of skip units 520 matches the number of redundant rows 510 (for example, N skip units may be used with N redundant rows); however, in other embodiments this constraint need not be met. Supplying multiple redundant rows and skip units allows the repair mechanism to compensate for multi-element defects 170. In other examples, the structured array 500 may be supplied with one or more redundant columns (instead of or in addition to the redundant rows 510) and corresponding skip unit(s) may be placed ahead of the x-decode circuit 150 and configured to skip bad column(s).

According to one embodiment, a control device such as a programmable read-only memory (PROM) 530 supplies bad row and/or bad column addresses to the skip units 520a, 520b. In one example, the PROM 530 comprises a plurality of polysilicon fuses, also referred to as one-time-programmable (OTP) fuses or eFuses (electrical fuses). Furthermore, it is not necessarily the case that the PROM 530 is included on the same integrated circuit as the structured array. The PROM 530 may be configured to scan in bad row (or column) locations from another circuit location on or off the integrated circuit that contains the PROM. Furthermore, in some examples, bad row locations may be dynamically created each time the circuit is rebooted, for example, through a test mechanism (such as Built-In Self Test (BIST) or Programmable BIST (PBIST), for example).

Figure 6:
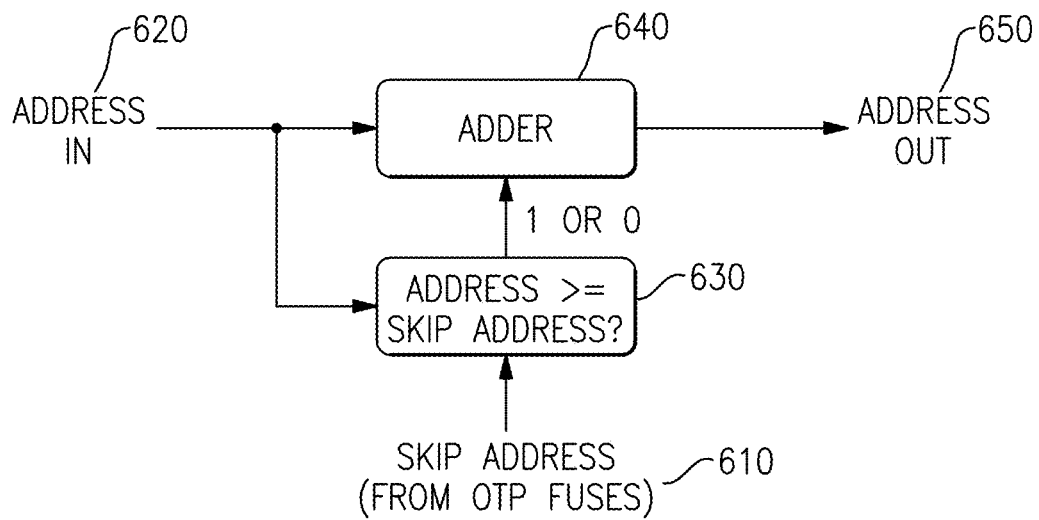
FIG. 6 is a block diagram of one example implementation of a skip unit according to aspects of the invention.

FIG. 6 illustrates an example of a skip unit implementation according to one embodiment. A skip address 610 is supplied to the skip unit from the PROM 530, as discussed above. The skip addresses 610 identify a bad row or bad region of rows. As discussed above, in other examples, the skip addresses may identify a bad column or region of columns. The input address 620 to the skip unit is compared with the bad row address (skip address). In one example, if the input address 620 is greater than or equal to the bad address, then the compare circuit 630 provides a binary value, for example, a "1" to a logical adder 640, thus incrementing the address past the bad row. If the input address is less than the bad address, then no "1" is added. The adjusted address 650 is then output from the skip unit and supplied to the y-decode or x-decode circuits, as appropriate. Thus, when an input address specifies a bad row (or column) that cannot be utilized due to a defect, the output address is modified by the skip unit(s) to select the next row (or column) in series. For example, for a single-element defect as shown in FIG. 2, an input address specifying row 9 may be modified such that the adjusted address specifies row 10, thereby avoiding the affected element 110a. To repair a multi-element defect 170, as shown in FIG. 5, the first skip unit 520a may supply a first modified address to the second skip unit 220b, specifying that the address be moved from row 7 to row 8. The second skip unit 220b, then further modifies the address to move from row 8 to row 9, an unaffected row (see steps—of FIG. 4). In an alternate embodiment, where a number of rows can be skipped (the number supplied by a PROM or other source), rows 7 and 8 may be skipped by adding "2".

Figure 7:
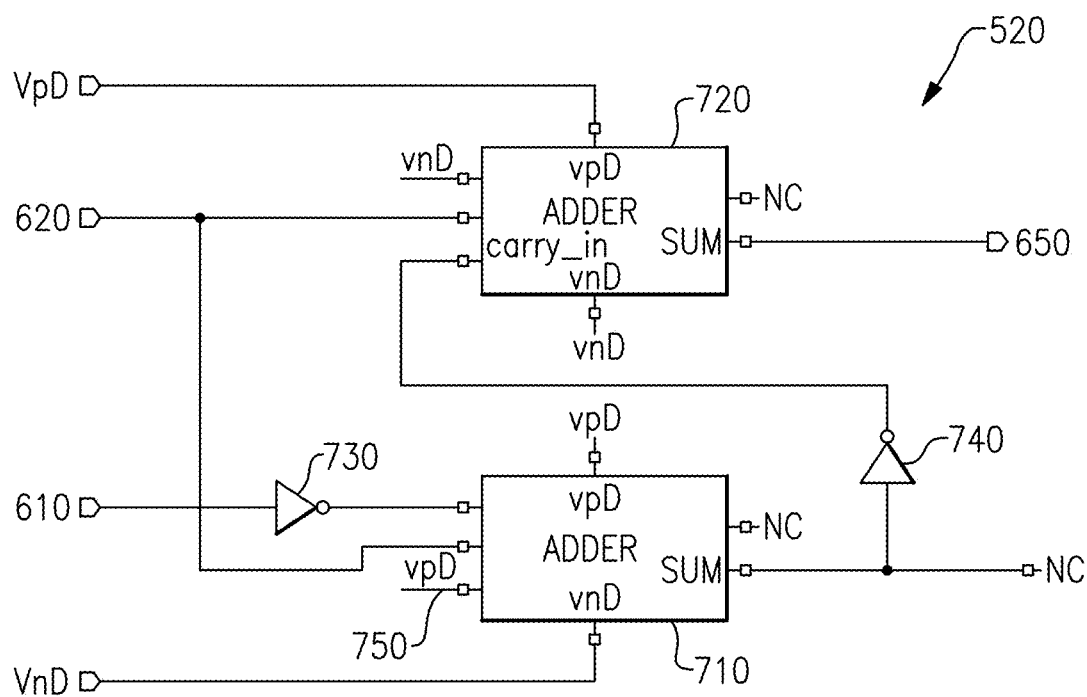
FIG. 7 is a schematic diagram of one example of a skip unit implementation according to aspects of the invention.

Referring to FIG. 7 there is illustrated an example of a skip unit 520 implemented using a pair of adders 710, 720 and associated inverters 730, 740. In this example implementation, the first adder 710 implements a compare function (comparing the input address 620 with the skip address 610) using 2's compliment arithmetic. A subtraction of the input address 620 minus the skip address 610 is performed by inverting the skip address 610 and the insertion of a logic "1" into the carry input 750 of the first adder 710. The inversion of the most significant bit (using inverter 740) of the output sum from the first adder 710 now represents the function of the input address being greater than or equal to the skip address meaning that the input address 620 has reached a bad row (or column). It will be appreciated by those skilled in the art, given the benefit of this disclosure, that FIG. 7 illustrates one example of a method for modifying the address to skip; however, there are many circuit mechanisms that may be used to achieve this effect, and at least some of these may be synthesized (versus a direct circuit implementation).

As discussed above, the repair mechanism may be used to skip bad rows and/or columns by including redundant rows and/or columns in the array. In another example, the repair mechanism may be used to provide region-based repair. For example, the skip address may specify the starting and ending row or column of a bad region for repair, thus identifying a skip region. Alternatively, the skip address may identify the first bad row (or column) and an additional span vector may indicate how many rows (or columns) to skip. Thus, referring to FIG. 6, in a region-based repair example, instead of adding a binary "1", a span vector (for example, 8, 10, 16, etc.) may be added to the input address. It is to be appreciated that for arrays with repairable regions, it may be likely that more redundant rows (or columns) would be included in the array (for repair) than the number of skip units. Similarly, in a three-dimensional array, skip units may be programmed to skip chip-levels, in addition to or instead of rows and/or columns. In the above examples, the skip addresses are supplied in ascending order, and begin when the input address is equal to or higher than the bad address. Accordingly, the skip units are programmed in successive order of higher addresses. Thus, referring to FIG. 5, skip unit 520b has a higher skip address than skip unit 520a. In other examples, the reverse scenario may be implemented, such that if the input address is equal to or lower than the bad address, the skip unit(s) may modify the addresses by subtracting values (e.g., a binary "1") from the input address to shift the address lower in the array. In these examples, the skip addresses from multiple skip units may be supplied in descending order.

Thus, aspects and embodiments provide a simple repair mechanism that may be implemented with little or no modification to the underlying array of addressable elements, other than the inclusion of the redundant elements. Any number of redundant rows, columns or layers may be including, with, in one example, a corresponding number of skip units. As discussed above, in the case of multiple skip units, the skip units may be cascaded ahead of the x-decode or y-decode circuits. The skip units may be configured to refer to blocks or regions of rows or columns, not only to primary rows or columns. Thus, the smallest replaceable unit an array is not limited to single rows or columns of bit cells. In certain examples, sub-array units of an array, such as an SRAM or register file, may be replaced. In other examples, rows of sub-arrays within an SRAM module may be replaced.

Embodiments of the repair mechanism may be used and useful in numerous different devices and systems. In some devices, the regular array structures of RAMs (particularly SRAMs) comprise the majority of the area of an integrated circuit (IC). In some examples, RAMs may comprise 70% or more of the area of an IC. In addition, in some examples, these ICs are quite large in total area as well (up to 2 cm by 3 cm, for example). Focal Plane Array Read-Out ICs (FPA ROICs) provide an example of a device having such a very large IC area. Using SRAM in FPA ROICs may provide certain advantages, including that SRAM provides an efficient storage medium for digital values, allowing for larger and denser arrays to be created. For example, in one example of an FPA ROIC, the SRAM may comprise 50% to 80% of the ROIC area. However, as a consequence of large IC size and since SRAM is a dense circuit, the distribution of defects can substantially reduce yields, causing a potential loss of usable IC product(s) and/or driving up the cost of an IC. Aspects and embodiments of the repair mechanism may replace bad SRAM components with good SRAM components, as discussed above, and thus improve yield by repairing bad SRAM sections, and thereby reduce fallout and per-unit ROIC cost.

Figure 8:
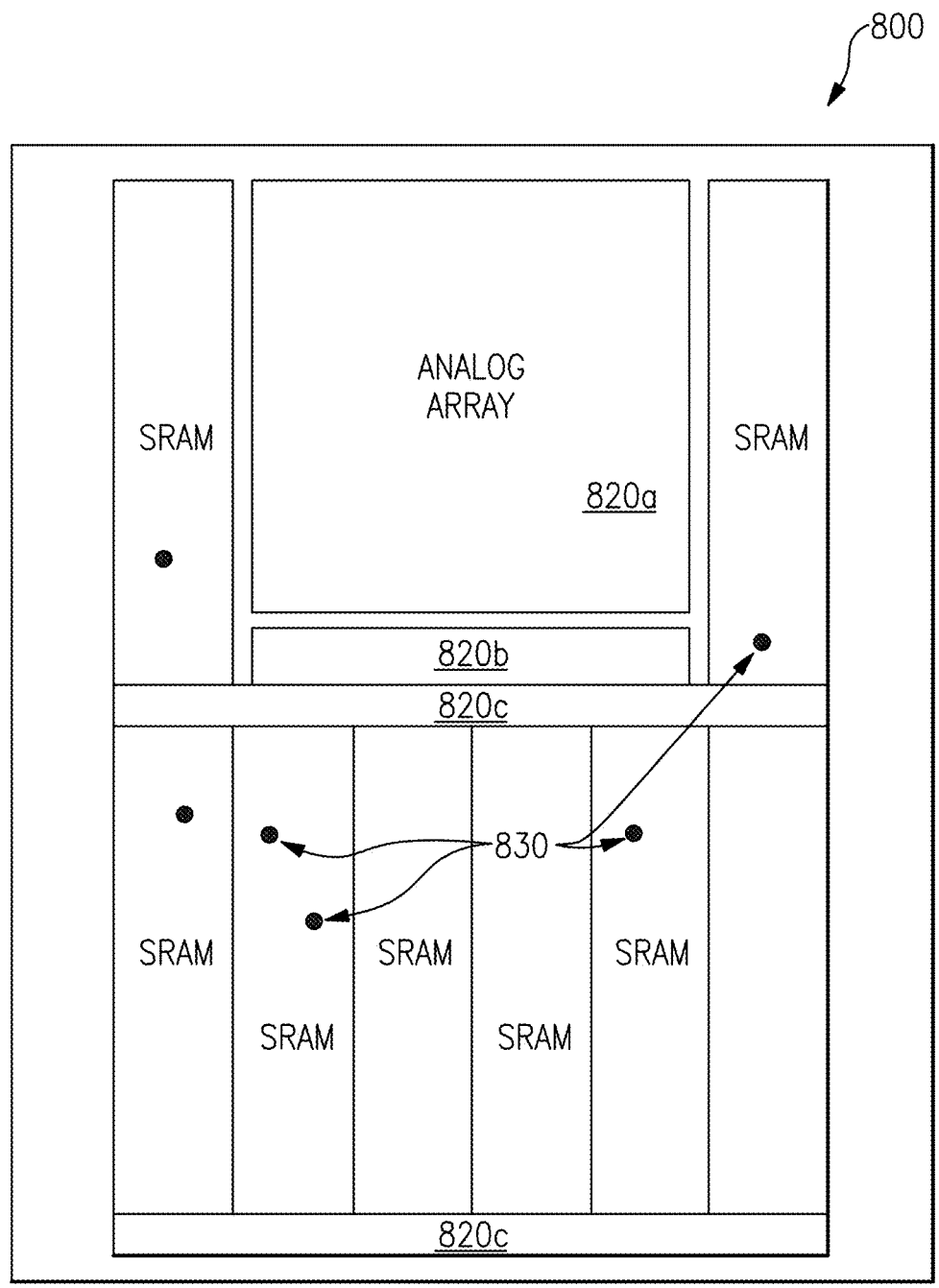
FIG. 8 is a block diagram illustrating that defect repair may be modular, according to aspects of the invention.

FIG. 8 is a block diagram of an example of an ROIC 800 including many SRAM modules 810, along with other circuitry areas 820, such an analog array 820a (e.g., detector circuitry if the ROIC is an FPA or other imaging device), analog-to-digital converters 820b, digital processing and/or control circuitry 820c, etc. In one embodiment, each SRAM module 810 may have two redundant rows of sub-arrays (not shown), and each module may include a set of PROM bits to identify up to two bad rows of sub-arrays. In one example, the PROMs for each SRAM module 810 are independent. In this manner, many dispersed SRAM defects 830 may be repaired, leading to IC yield improvement. Thus, in the example of an FPA ROIC, single-point defects of the analog array 820a may become the yield limiter, and since in some examples the analog array is a far smaller percentage of the overall ROIC size (as discussed above), the overall ROIC yield may be substantially improved. As discussed above, in other embodiments, the SRAM modules 810 may include redundant columns or layers of sub-arrays, in addition to or instead of redundant rows.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. A repair device for a digital addressable structured array of elements comprising:
   at least one set of repair elements placed within the structured array;
   at least one skip unit configured to receive and modify an input address of a defective array element within the array and to provide a modified address corresponding to a non-defective array element within the array; and
   an address decode unit coupled between the at least one skip unit and the array and configured to receive and decode the modified address from the skip unit.

2. The repair device of claim 1, wherein the addressable structured array of elements is a static random access memory (SRAM).

3. The repair device of claim 1, wherein elements of the addressable structured array are arranged in rows and columns, the at least one set of repair elements includes at least one row of repair elements, and the address decode unit includes a row-address decode unit.

4. The repair device of claim 3, wherein the at least one row of repair elements includes two rows of repair elements, and the at least one skip unit includes a first skip unit and a second skip unit, the first and second skip units being cascaded together in series.

5. The repair device of claim 4, wherein the first skip unit is configured to provide a first modified address, the first modified address being higher than the input address; and wherein the second skip unit is configured to receive the first modified address and to provide a second modified address, the second modified address being higher than the first modified address.

6. The repair device of claim 4, wherein the first skip unit is configured to provide a first modified address, the first modified address being lower than the input address; and wherein the second skip unit is configured to receive the first modified address and to provide a second modified address, the second modified address being lower than the first modified address.

7. The repair device of claim 1, wherein elements of the addressable structured array are arranged in rows and columns, the at least one set of repair elements includes at least one column of repair elements, and the address decode unit includes a column-address decode unit.

8. The repair device of claim 1, wherein the at least one skip unit includes:

a comparator configured to receive and compare the input address and a skip address, and to provide a modification command responsive to determining that the input address is equal to or greater than the skip address; and a logical adder coupled to the comparator and configured to add a predetermined number to the input address to provide the modified address responsive to the modification command.

9. The repair device of claim 8, wherein the comparator includes a first adder, and the logical adder includes a second adder, and the skip unit further includes a first inverter and a second inverter;

wherein an output of the first adder is coupled via the first inverter to an input of the second adder.

10. The repair device of claim 8, further comprising a control unit coupled to the skip unit and configured to provide the skip address to the skip unit, the skip address identifying the defective array element.

11. The repair device of claim 10, wherein the control unit includes a programmable read-only memory configured to store the skip address.

12. An integrated circuit including a built-in repair device, the integrated circuit comprising:

at least one digital addressable structured array of elements having a plurality of elements arranged in rows and columns;

a decode address unit coupled to the at least one digital addressable structured array;

at least one set of repair elements contained within the at least one digital addressable structured array; and at least one skip unit coupled to the decode address unit, the skip unit having a first input to receive an input address and a second input to receive a skip address, the skip address identifying a defective element within the at least one digital addressable structured array;

wherein the skip unit is configured to modify the input address based on a determination that the input address is equal to or greater than the skip address and to provide a modified address to the address decode unit.

13. The integrated circuit of claim 12, wherein at least one digital addressable structured array of elements includes a plurality of SRAM modules, the at least one set of repair elements includes a plurality of independent sets of repair units, at least one set of repair units being contained within each one of the plurality of SRAM modules; and wherein the at least one skip unit includes a corresponding plurality of skip units, such that at least one skip unit is associated with each SRAM module.

14. The integrated circuit of claim 12, further comprising an analog array coupled to at least one of the plurality of SRAM modules.

15. A method of repairing a digital addressable structured array of elements, the method comprising:

receiving an input address;

receiving a skip address identifying a defective element within the digital addressable structured array of elements;

modifying the input address based on a comparison of the input address and the skip address to provide a modified address; and decoding the modified address to address a non-defective element within the digital addressable structured array of elements.

16. The method of claim 15, wherein modifying the input address includes:

determining that the input address is equal to or greater than the skip address; and adding a predetermined number to the input address to provide the modified address.

17. The method of claim 15, wherein receiving the skip address includes receiving a first skip address and a second skip address, and wherein modifying the input address includes:

determining that the input address is equal to or greater than the first skip address;

adding a first predetermined number to the input address to provide an intermediate address;

determining that the intermediate address is equal to or greater than the second skip address; and adding a second predetermined number to the intermediate address to provide the modified address.

* * * * *